United States Patent
Pressel et al.

(10) Patent No.: US 8,237,259 B2
(45) Date of Patent: Aug. 7, 2012

(54) EMBEDDED CHIP PACKAGE

(75) Inventors: Klaus Pressel, Regensburg (DE); Gottfried Beer, Nittendorf (DE)

(73) Assignee: Infineon Technologies AG, Neubiberg (DE)

( * ) Notice: Subject to any disclaimer, the term of this patent is extended or adjusted under 35 U.S.C. 154(b) by 819 days.

(21) Appl. No.: 11/762,411

(22) Filed: Jun. 13, 2007

(65) Prior Publication Data

US 2008/0308917 A1 Dec. 18, 2008

(51) Int. Cl.
*H01L 23/053* (2006.01)
*H01L 23/12* (2006.01)

(52) U.S. Cl. ........... 257/700; 257/E23.011; 257/678; 257/684; 438/125; 438/689

(58) Field of Classification Search ........... 257/E23.031, 257/E23.116, 678, 676, 690, 700, 723, E23.011, 257/680, 684, 784; 438/106, 108, 110, 112, 438/113, 126, 125, 462, 689; 29/831, 832, 29/846

See application file for complete search history.

(56) References Cited

U.S. PATENT DOCUMENTS

| | | | |
|---|---|---|---|
| 3,579,056 A | 5/1971 | TeVeld et al. | |
| 5,241,456 A | 8/1993 | Marcinkiewicz et al. | |
| 5,353,498 A * | 10/1994 | Fillion et al. | 29/840 |
| 5,847,951 A | 12/1998 | Brown et al. | |
| 6,107,179 A * | 8/2000 | Zomorrodi et al. | 438/612 |
| 6,114,048 A * | 9/2000 | Jech et al. | 428/547 |
| 6,423,570 B1 * | 7/2002 | Ma et al. | 438/106 |
| 6,486,005 B1 * | 11/2002 | Kim | 438/118 |
| 6,555,906 B2 * | 4/2003 | Wermer et al. | 257/723 |
| 6,680,529 B2 * | 1/2004 | Chen et al. | 257/700 |
| 6,707,137 B2 * | 3/2004 | Kim | 257/668 |
| 6,727,576 B2 * | 4/2004 | Hedler et al. | 257/678 |
| 6,734,534 B1 | 5/2004 | Vu et al. | |
| 6,746,898 B2 * | 6/2004 | Lin et al. | 438/113 |
| 6,747,361 B2 | 6/2004 | Ichinose | |
| 6,750,397 B2 * | 6/2004 | Ou et al. | 174/524 |
| 6,759,270 B2 * | 7/2004 | Infantolino et al. | 438/106 |
| 6,762,488 B2 | 7/2004 | Maeda et al. | |
| 6,905,914 B1 * | 6/2005 | Huemoeller et al. | 438/118 |
| 6,927,095 B2 * | 8/2005 | Smith | 438/107 |
| 6,977,436 B2 * | 12/2005 | Tsai et al. | 257/738 |
| 7,011,989 B2 * | 3/2006 | Becker et al. | 438/113 |
| 7,041,534 B2 * | 5/2006 | Chao et al. | 438/114 |
| 7,132,312 B2 * | 11/2006 | Huang et al. | 438/113 |

(Continued)

FOREIGN PATENT DOCUMENTS

| | | |
|---|---|---|
| DE | 1803138 | 6/1969 |
| DE | 19954941 | 11/2003 |
| EP | 0049791 | 4/1982 |
| WO | 01/37338 | 5/2001 |
| WO | 2006134217 | 12/2006 |

OTHER PUBLICATIONS

Jung, Erik, "Chip in Polymer," Institut Zuverlassigkeit und Mikrointegration, pp. 1 (Date Unknown) <http://www.pb.izm.fhg.de/avt/005_projects/ChipInPolymer_de.html>.
Brunnbauer, M. et al., "Embedded Wafer Level Ball Grid Array (eWLB)", IEEE Electronics Packaging Technology Conference, ps. 1-5 (2006).
Blackshear, E.D. et al., "The evolution of Build-Up Package Technology and its Design Challenges", IBM J. Res. & Dev., vol. 49, No. 4/5, ps. 641-661 (Jul./Sep. 2005).

*Primary Examiner* — Chris Chu
(74) *Attorney, Agent, or Firm* — Dicke, Billig & Czaja, PLLC (57) ABSTRACT

An electronic assembly is disclosed. One embodiment includes at least one semiconductor chip and a package structure embedding the semiconductor chip. The package structure includes at least one conducting line extending into an area of the package structure outside of the outline of the chip. The electronic assembly further includes a substrate embedding the package structure.

16 Claims, 7 Drawing Sheets

U.S. PATENT DOCUMENTS

| | | | |
|---|---|---|---|
| 7,170,152 B2 * | 1/2007 | Huang et al. | 257/678 |
| 7,208,344 B2 * | 4/2007 | Ho | 438/107 |
| 7,276,783 B2 * | 10/2007 | Goller et al. | 257/678 |
| 7,326,592 B2 * | 2/2008 | Meyer et al. | 438/110 |
| 7,413,926 B2 * | 8/2008 | Smith | 438/107 |
| 7,550,857 B1 * | 6/2009 | Longo et al. | 257/777 |
| 7,572,681 B1 * | 8/2009 | Huemoeller et al. | 438/125 |
| 7,615,411 B2 * | 11/2009 | Jobetto | 438/109 |
| 2004/0014317 A1 * | 1/2004 | Sakamoto et al. | 438/689 |
| 2004/0227258 A1 | 11/2004 | Nakatani | |
| 2005/0112798 A1 | 5/2005 | Bjorbell | |
| 2005/0230799 A1 | 10/2005 | Kang | |
| 2006/0008944 A1 * | 1/2006 | Shizuno | 438/109 |

* cited by examiner

FIG 19

EMBEDDED CHIP PACKAGE

BACKGROUND

The invention relates to embedding electronic components into a substrate.

Embedding active devices into a substrate has been realized as a promising technology for applications in which size, thickness and weight of electronic devices are sought to be minimized. Such requirements are often encountered in portable applications such as cell-phones, laptop PCs, palms, PDUs (Personal Digital Assistant) etc.

Recently, chips have been directly embedded into build-up layers of SBU (Sequential Build-up) laminate substrates. This concept is known as Chip in Polymer (CiP) technology. In this approach, chips are mounted e.g., on a core of the substrate and embedded inside a film of dielectric layer.

In another embodiment, a cavity is formed in a substrate and the chip is placed inside this cavity. The chip is then bonded by conventional bonding techniques.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Fan-out type packages are packages embedding a chip, wherein at least some of the package pads and/or conducting lines connecting the chip to the package pads are located laterally outside of the outline of the chip or do at least intersect the outline of the chip. Thus, in fan-out type packages, a peripherally outer part of the package of the chip is typically (additionally) used for electrically bonding the package to external applications (e.g., application boards etc.). This outer part of the package encompassing the chip effectively enlarges the contact area of the package in relation to the footprint of the chip, thus leading to relaxed constrains in view of package pad size and pitch with regard to later processing, e.g., second level assembly.

Embodiments of fan-out type packages described in the following may be of various design. The fan-out area around the chip may be provided by a surface of a mold compound used for encapsulating the chip. Another possibility is to mount the chip on a substrate (or leadframe) chip carrier having lateral dimensions larger than the chip dimensions and to exploit a peripheral region of the laminate substrate chip carrier as a fan-out area.

Embodiments of the package may use various types of chips, among them logic integrated circuits, analog integrated circuits, mixed signal integrated circuits, sensor circuits, MEMS (Micro-Electro-Mechanical Systems), power integrated circuits, chips with integrated passives, passives etc.

Embodiments of the substrate may include substrates of different type and configuration, in particular PCBs (Printed Circuit Boards), SBU (Sequential Build-Up) laminate substrates, ceramic substrates, leadframes and mold compounds, e.g., MIDs (Molded Interconnect Devices).

Embodiments for bonding the package pads to the wiring of the substrate may include thin-film technology, soldering, welding, diffusion or bond wire technologies.

Figure 1:
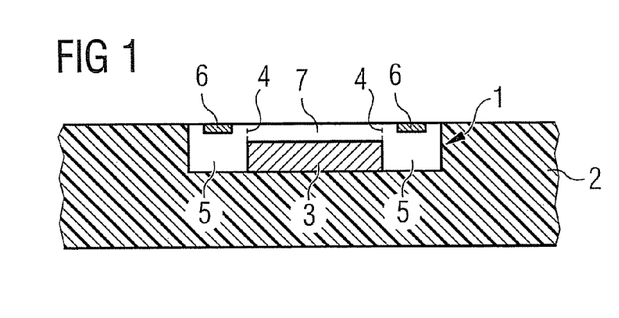
FIG. 1 illustrates a cross-sectional view of a substrate embedding a chip package.

FIG. 1 depicts a cross-sectional view of a first embodiment of the invention. Same reference signs designate like parts in the following drawings. A fan-out type package 1 is embedded in a substrate 2. The fan-out type package 1 contains a chip 3, the outline of which is indicated by dashed line 4.

A fan-out area 5 of the package 1 is delimited by the outline 4 of the chip 3 and the periphery of the fan-out type package 1. Pads 6 of the fan-out type package 1 are located at least partially within the fan-out area 5. Additional pads (not illustrated) may be distributed over a footprint area 7 of the fan-out type package 1.

The package pads 6 are bonded to chip pads (not illustrated) on the chip 3 by means (not illustrated) which will be exemplified further below. Virtually all known bonding techniques may be utilized.

Due to the increased space around chip 3 provided by the fan-out area 5 for the pads 6 (i.e. the interconnect of the package 1), fan-out packages 1 allow to increase the number of package pads 6 and/or the pitch of package pads 6 compared to fan-in packages or bare chip solutions. As a consequence, embedding fan-out type packages 1 in a substrate 2 is beneficial in view of several aspects:

A fan-out type package 1 provides a good protection to the chip 3 against outside damages. Especially, it is possible to protect all surfaces of the chip 3, if the package 1 completely encapsulates chip 3. Typically, at least the lateral edge of chip 3 may be protected by the package 1 by the part of the package 1 which creates the fan-out area 5.

Semiconductor material is expensive resulting in that the chip size is permanently shrinking. Fan-out type packaging provides a low cost possibility to maintain package interconnect dimensions and geometry through the shrinkage of chip size. Consequently, the wiring provided within or on the substrate must not be modified when new technologies provide for smaller chips 3.

Fan-out type packages might have a high level test coverage to meet the "known good die/device" aspects.

As the size and/or pitch of the package pads 6 may be relatively large in fan-out type packages 1, geometric tolerances are less stringent for fan-out solutions than for fan-in solutions in any bonding process applied for connecting the package pads 6 to substrate wiring (not illustrated) or external applications. Thus, the overall yield for a package-in-substrate structure is significantly enhanced when using fan-out type packages instead of fan-in structures.

Fan-out type packages facilitate repair approaches compared to the case in which bare chips or fan-in structures are embedded in a substrate.

Fan-out type packages allow for an improved shielding of the chip 3, because more space is provided on or in the package structure for applying a metallization for shielding especially in the peripheral region of the chip 3.

Figure 2:
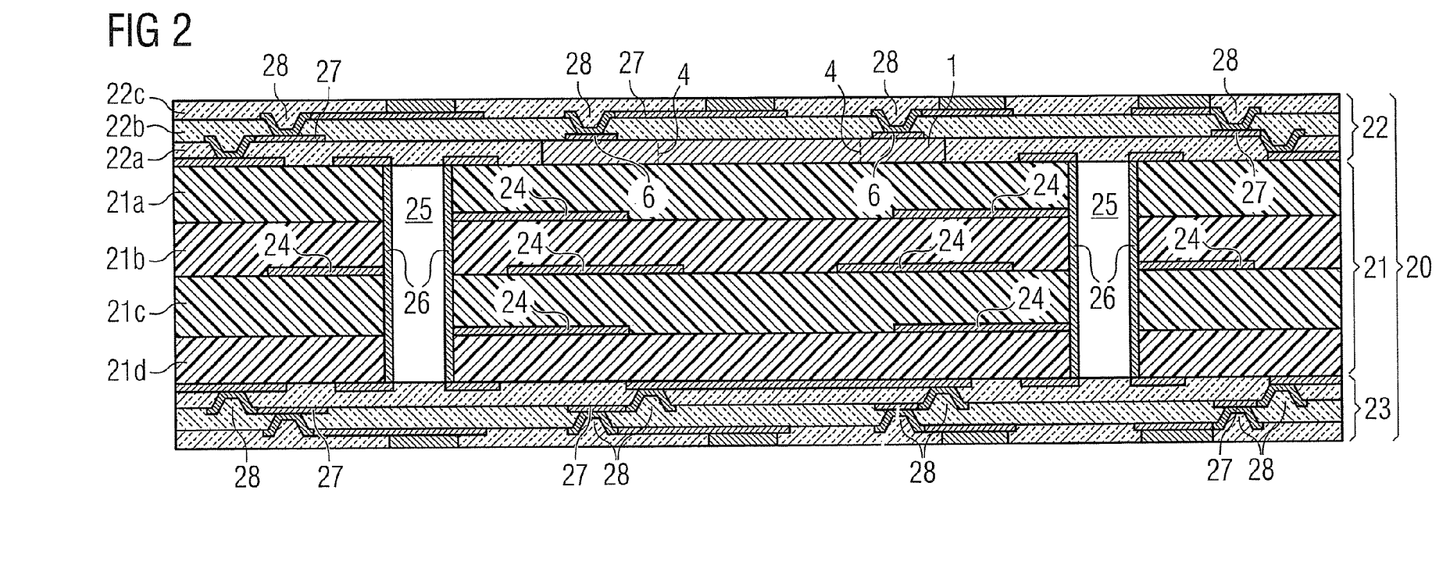
FIG. 2 illustrates a cross-sectional view of a substrate including build-up layers embedding a chip package.

FIG. 2 depicts a fan-out type package 1 embedded in a substrate 20. Substrate 20 is an SBU laminate substrate. SBU laminate substrate 20 includes a core 21 provided by one or more (here: four) core layers 21a, 21b, 21c, 21d and build-up layers 22, 23 at both sides of the core 21.

Each core layer 21a, 21b, 21c, 21d may be composed of glass-fiber-reinforced epoxy resin. Core layers 21a, 21b, 21c, 21d made of a fluoropolymer material such as e.g., polytetrafluoroethylene, aramid fibers, or carbon fibers may also be used. Metal layers 24 are arranged between the core layers 21a, 21b, 21c, 21d. By way of example, if carbon fibers are used, core layers 21a, 21b, 21c, 21d and metal layers 24 may form a copper-carbon fiber compound material. Core vias 25 are arranged to penetrate the core layers 21a, 21b, 21c, 21d and are used to electrically connect specific metal layers 24 of the multi-layer core 21. To this end, the core via 25 is internally coated by a metal jacket 26. As it is apparent for a person skilled in the art, the design of the core 21 is similar to the design of a conventional PCB and may be formed by conventional laminated PCB processing techniques. Thus, core vias 25 are typically formed by mechanical drilling and extend through the entire core 21. Core thickness may be in the range of several hundreds μm and the via size may be in the range of one or multiple hundreds of μm.

The fan-out type package 1 may be mounted on the uppermost core layer 21a. Here it is embedded in build-up layer 22a and covered by build-up layers 22b, 22c. Build-up layers 22a, 22b, 22c may be a dielectric, e.g., silica-filled epoxies plated by metal layers 27. Metallized vias 28 interconnect between adjacent metal layers 27.

Typically, the build-up layers 22, metal layers 27 and vias 28 are generated by thin-film processing techniques. For example, vias 28 which are typically blind and buried may be formed by laser drilling and are tapered, having different lower and upper diameters. Other techniques like photo-structuring might also be used. Metallization of vias 28 may be formed by sputtering or plating a metal over the entire surface of the underlying build-up layer 22a, 22b, 22c. Then, a photoresist material is applied and patterned. The desired metal pattern is obtained by etching the unprotected metal layer 27. Other techniques, such as printing, ink jetting or laser direct structuring a conductive material or catalytic starter may also be used. Multiple build-up layers 22a, 22b, 22c, corresponding vias 28 and metal layers 27 are formed by applying an addition dielectric film and repeating the via formation and metallization processes. Passive components (not illustrated) such as capacitors, resistors and inductors may be embedded during the layer build-up process.

The lower build-up layers 23 are formed using a similar step-wise building process.

Typically, most of the wiring capability of the SBU laminate substrate 20 occurs in the build-up layers 22, 23. To this end, the trace and space dimensions in the build-up layers 22, 23 are significantly finer than those in the core 21. The thickness of build-up layers, e.g., 22b, 22c, may be in the range of about 10 μm and the diameter of via 28 may be some tens of μm. Layers 22a and 22b may be combined to one layer and may be thicker than the typical 10 μm at least on the package corners to incorporate the package. In SBU laminate substrate 20, often signal routing is performed within the build-up layers 22, 23 whereas power distribution is accomplished by the core 21. Further, the core 21 provides for an adequate rigidity of the SBU laminate substrate 20.

As illustrated in FIG. 2, the fan-out type package 1 may be attached directly on the uppermost core layer 21a and/or embedded within a single build-up layer 22a. However, the fan-out type package 1 may also be embedded in multiple build-up layers 22a, 22b, 22c (i.e. the height of the fan-out type package 1 may correspond to the height of several build-up layers 22a, 22b, 22c) or may be disposed on a build-up layer 22a, 22b, 22c rather than directly on the uppermost core layer 21a. Further, it is possible that the fan-out type package 1 is embedded into the core 21, i.e. encapsulated in one or more core layers 21a, 21b, 21c, 21d, rather than in one or more of the build-up layers 22a, 22b 22c.

Figure 3:
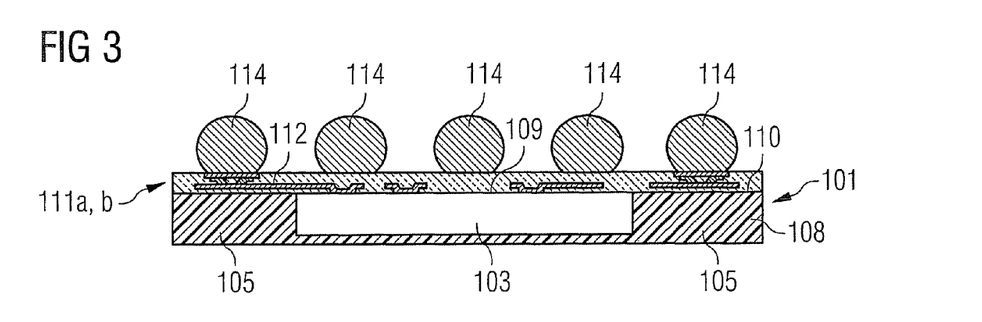
FIG. 3 is a cross-sectional side view of a first fan-out type package.

FIG. 3 illustrates an embodiment of a first fan-out type package 101. The fan-out type package 101 includes a chip 103 embedded in a matrix of mold compound 108. More specifically, the backside of the chip 103 and its edges are covered with mold compound 108, with the fan-out area of the mold compound 108 being denoted by the reference sign 105. The mold compound 108 may be a duroplastic resin, a thermosetting plastic material, a thermoplastic resin or a composite compound. The active surface 109 of the chip 103 lies flush with the upper surface 110 of the fan-out area 105 of the mold compound 108, and a first dielectric layer 111a, a metal redistribution layer 112 and a second dielectric layer 111b extend over the plane composed of the active surface 109 of the chip 103 and the upper surface 110 of the mold compound 108, compare FIG. 4. The first and second dielectric layers 111a, 111b and the metal redistribution layer 112 may be manufactured in a thin-film process onto the plane composed of the active surface 109 of the chip 103 and the upper surface 110 of the fan-out area 105 of the mold compound 108. The fabrication of the first and second dielectric layers 111a, 111b as well as the metal redistribution layer 112 and the generation of via 113 may be accomplished by applying thin-film technology processes as explained in conjunction with the manufacturing of the build-up layers 22, 23 depicted in FIG. 2. Thus, via 113 may be formed photo-lithographically, jetted or by laser drilling and the redistribution layer 112 may be structured by photo-lithographic processes. Higher number of layers might be applied when needed.

Figure 4:
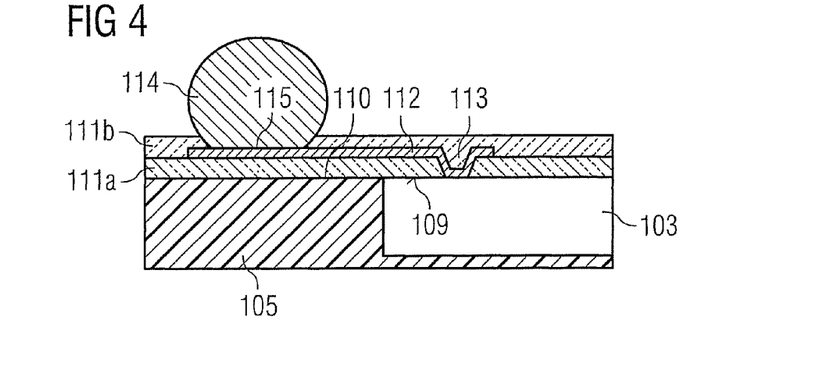
FIG. 4 illustrates a detail of FIG. 3.

The second, upper dielectric layer 111b may serve as a solder stop when solder balls 114 are optionally applied to exposed contact regions 115 of the metal redistribution layer 112. Instead of solder balls 114, it is also possible that solder bumps of less height showing a smoother curved, lenticular surface or flat metal contact posts (which might be applied by a non-galvanic plating process) are deposited on the exposed contact region 115 of the metal redistribution layer 112.

Fan-out type package 101 may be fabricated in an embedded device technology based on a molded reconfigured wafer. This embedded device wafer level packaging (eWLP) technology is developed from standard wafer level packaging (WLP) technology. Standard WLP technology is defined such that virtually all technology processes are performed on wafer level. More specifically, in standard WLP, dielectric and metal layers such as layers 111a, 111b and 112 are deposited and processed on the active surface of the wafer before the wafer is cut into single chips. Consequently, standard WLPs are always fan-in solutions. In contrast to WLP technology, in eWLP technology the front-end processed and probed wafer is first singulated to obtain single chips. The chips 103 are then placed onto a support in a spaced-apart relationship. In the next process, the spaced-apart chips 103 on the support are molded, e.g., by using a liquid mold compound that is dispensed over the chips 103 on the support. Thereby, the gaps between the placed chips are filled with liquid mold compound. After curing the mold compound, the support is removed to obtain the reconfigured wafer, in which the chips are distributed within the mold compound in a regular, array-like fashion. This reconfigured wafer is then processed according to standard WLP technology, i.e. the dielectric layers 111a, 111b and the metal redistribution layer 112 are applied typically by using thin-film processes. Moreover, appropriate connecting elements such as solder balls 114, solder bumps or metal elements may optionally be applied on wafer level. Only after finishing the fan-out package interconnect, the molded reconfigured wafer is singularized into single packages such as, for instance, illustrated in FIG. 3.

Figure 5:
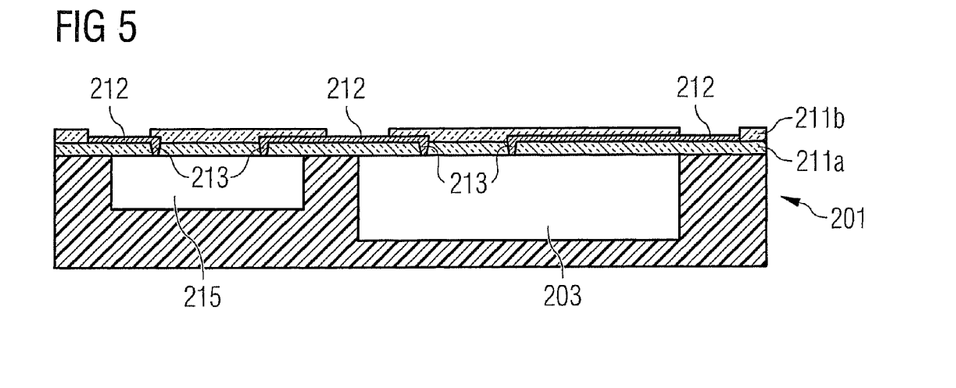
FIG. 5 illustrates a cross-sectional side view of a second fan-out type package including a chip and a further electronic component.

FIG. 5 illustrates a second fan-out type package 201. The fan-out type package 201 distinguishes from the fan-out type package 101 mainly in that the package 201 encapsulate a chip 203 and a further electronic component 215 (more than one further component could be applied, but by way of simplification only one is depicted). The further electronic component 215 may be a passive element, e.g., a capacitor, a resistor or an impedance, or may be another integrated circuit. The further component 215 is interconnected to the chip 203 via an interconnect structure including first and second (for many practical cases only one dielectric will be sufficient) dielectric layers 211a, 211b, vias 213 and a structured metal redistribution layer 212 similar to layers 111a, 111b, vias 113 and the structured metal redistribution layer 112 as explained above. The second package 201 represents an SiP (System in Package), as it includes more than one electronic components encapsulated by the package 201. For fabrication, eWLP technology may be applied in the same way as described in conjunction with FIGS. 3, 4.

Figure 6:
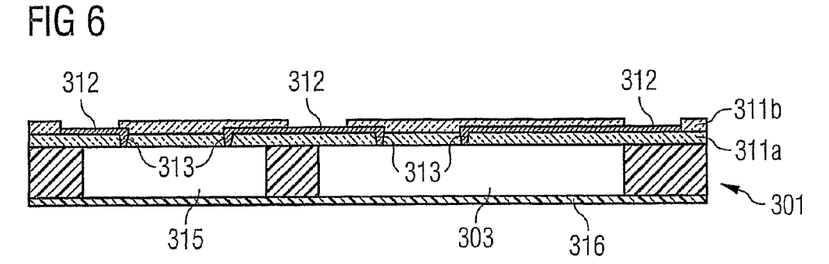
FIG. 6 illustrates a cross-sectional side view of a third fan-out type package including a chip and a further electronic component.

FIG. 6 illustrates a third fan-out type package 301 similar to 201 which likewise represents an SiP. More specifically, fan-out type package 301 includes a chip 303, a further electronic component 315, first and second dielectric layers 311a, 311b, vias 313 and a metal redistribution layer 312 in accordance with the description of parts 203, 215, 211a, 211b, 213 and 212, respectively, as explained above in conjunction with FIG. 5. In contrast to the fan-out type package 201, fan-out type package 301 is equipped with a conductive layer 316 at the backside of chip 303 and/or electronic component 315 (which may likewise be an integrated circuit). The layer 316 may also be a dissipative layer having a higher specific electrical resistance than conductive layers typically used for signal distribution. The conductive layer 316 may be structured (not illustrated in FIG. 6). It could serve for different functions such as providing an interconnect to chip 303 and/or electronic component 315, providing a shielding against electromagnetic interference to the fan-out type package 301 and providing for an improved thermal transfer of heat out of the fan-out type package 301. The conductive layer 316 may be of a conductive polymer (especially if it is intended to provide for shielding) or may be made of metal. There might also be a dielectric layer and/or multilayers between the components 303, 315. Fabrication of the fan-out type package 301 may be again performed using eWLP technology as described above. It is to be noted that packages 101, 201 may likewise be equipped with such conductive layer at the backside and/or at the edge of the package 101, 102.

Further, in all fan-out type packages 101, 201, 301, the upper dielectric layer 111b, 211b, 311b may be omitted. That is because if fan-out type packages 101, 201, 301 are embedded, e.g., in an SBU laminate substrate 20 as illustrated in FIG. 2, the first build-up layer 22b covering the fan-out type package 101, 201, 301 may serve as a solder stop, i.e. may replace the upper dielectric layer 111b, 211b, 311b.

Further, it is to be noted that the fan-out type packages 101, 201, 301 shall be as thin as possible in order to facilitate the accommodation in the substrate. Thus, in all embodiments described herein, the chips may be thinned e.g., by mechanical grinding or chemical etching the backside of the chip 103, 203, 303.

Figure 7:
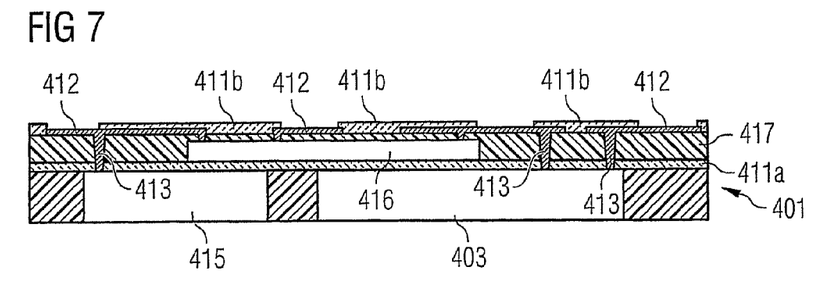
FIG. 7 illustrates a cross-sectional side view of a fourth fan-out type package containing stacked electronic components.

Nevertheless, fan-out type packages with stacked components are feasible. FIG. 7 illustrates a fan-out type package 401 which is designed and may be fabricated substantially in line with the descriptions of FIGS. 3 to 6. Briefly, parts denoted by reference signs 403, 415, 411a, 411b, 412 and 413 correspond to parts illustrated in FIG. 6 denoted by reference signs 303, 315, 311a, 311b, 312 and 313. In contrast to the example of the fan-out type package 301, the fan-out type package 401 includes a third electronic component 416 which is located above the chip 403 and the second electronic component 415. Similar to the second electronic component 415, the third electronic component 416 may be a passive element (resistor, inductor, capacitance) or an integrated circuit. The third electronic component 416 in the example illustrated is disposed on the first dielectric layer 411a and embedded in an intermediate dielectric layer 417 extending in between the first and second dielectric layers 411a, 411b. Similar to the fan-out type packages 101, 201, 301, the backside of the package 401 may be made of continuous mold compound (cf. FIGS. 3, 4, 5), a conductive layer 316 (cf. FIG. 6) or—as depicted in FIG. 7—may include one or more areas of bare semiconductor material.

Figure 8:
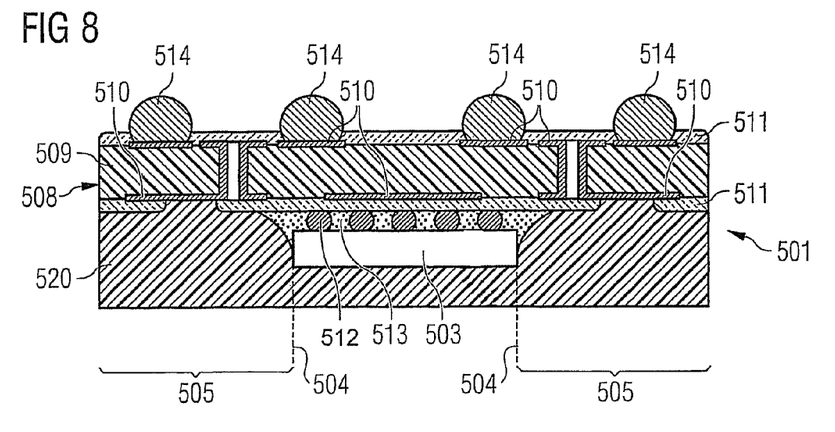
FIG. 8 illustrates a cross-sectional side view of a fifth fan-out type package containing a chip which is flip-chip mounted on a substrate chip carrier.
Figure 9:
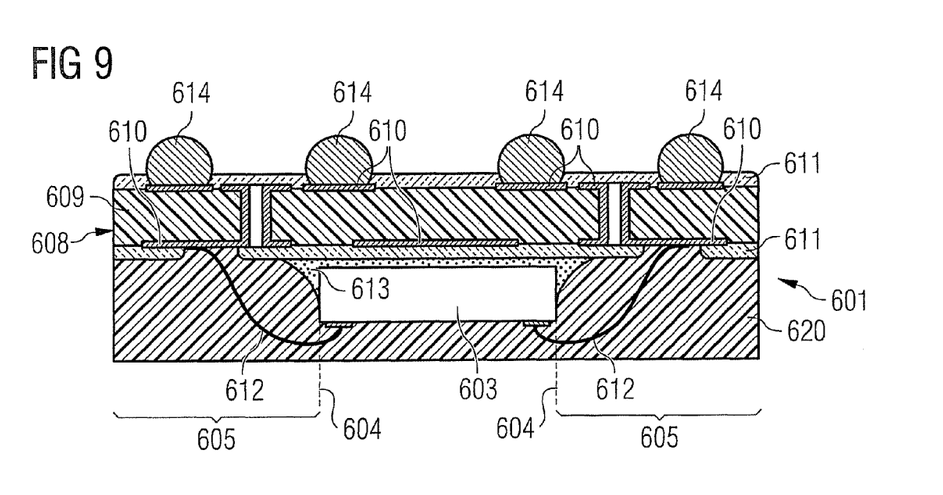
FIG. 9 illustrates a cross-sectional side view of a sixth fan-out type package containing a chip which is wirebond mounted on a substrate chip carrier.

FIGS. 8 and 9 illustrate fan-out type packages 501, 601 which are basically different to the fan-out type packages exemplified in FIGS. 3 to 7. Packages 501, 601 use a laminate substrate 508, 608 as a carrier for chip 503, 603. The lateral dimensions of the laminate substrate chip carrier 508, 608 in relation to the (lateral) outline 504, 604 of the chip 503, 603 define the available fan-out area 505, 605 provided by the packages 501, 601. The laminate substrate chip carrier 508, 608 is known as "interposer" in the art. In the depicted example it includes a core dielectric material 509, 609 metallized on both sides by structured metal layers 510, 610. Thin dielectric layers 511, 611 are applied to the structured metal layers 510, 610, e.g., to serve as a solder stop. The laminate substrate chip carrier 508, 608 is equipped with metallized vias in order to interconnect the structured metal layers 510, 610 on both sides of the core 509, 609. The chip 503 in FIG. 8 is flip-chip bonded to the laminate substrate chip carrier 508 by flip-chip solder bumps 512, whereas chip 603 in FIG. 9 is wire-bonded to the laminate substrate chip carrier 608 by bond wires 612. In FIG. 8 an underfill material 513 may be introduced between the chip 503 and the laminate substrate chip carrier 508. In FIG. 9 the chip 603 is fixed to the chip carrier 608 with the die attach material 613. Solder balls 514, 614 are contacted to the structured metal layer 511, 611 opposite to the chip 503, 603. Further, a mold compound 520, 620 is provided over the laminate substrate chip carrier 508, 608 and encapsulates the chip 503, 603 along with the bonding elements 512, 612. Packages as illustrated in FIGS. 8 and 9 are known as BGAs (Ball Grid Arrays). Another package group in this area which could be used is the VQFN (Very Thin Quad Flat), which is not depicted here.

Fan-out type mold compound packages 101, 201, 301, 401 and fan-out type BGA packages 501, 601 are integrated in e.g., substrates 2, 20 as illustrated in FIGS. 1, 2 with reference to fan-out type package 1. In other words, any description relating to the integration of fan-out type package 1 in substrate 2 or 20 applies to eWLP technology packages 101, 201, 301, 401 as well as laminate substrate chip carrier or any interposer based fan-out type packages like 501, 601 or/and VQFNs.

Further, substrate 2 may itself be a mold compound structure. An example for a process of integrating a fan-out type package 1 into a mold compound substrate is illustrated in FIGS. 10 to 14.

Figure 10:
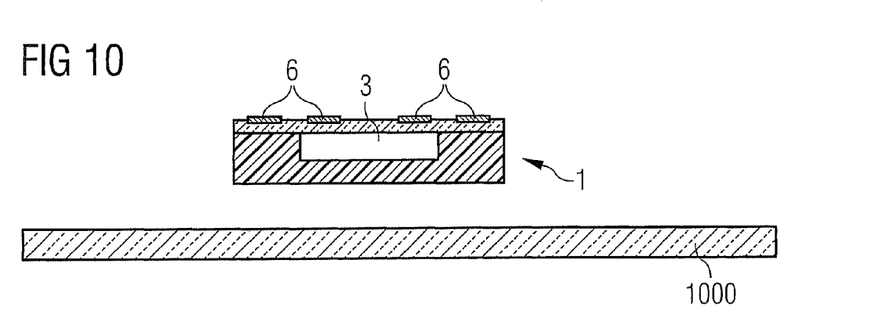
FIGS. 10 to 14 illustrate an example of a process flow used for embedding a fan-out type package into a substrate.
Figure 11:
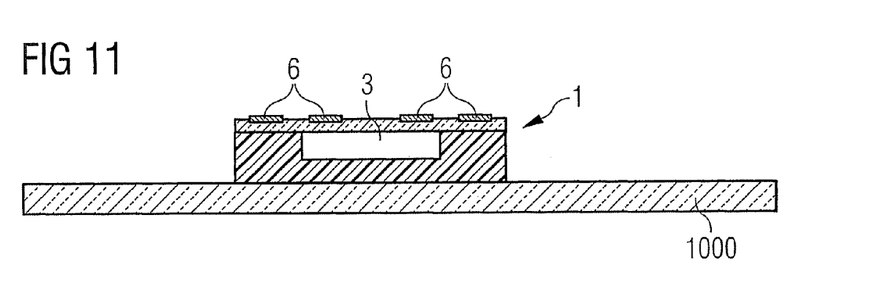
Figure 12:
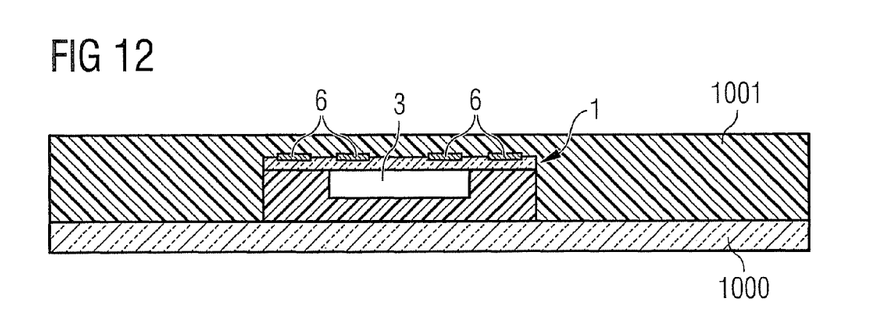

In FIG. 10, a fan-out type package 1 which may be designed in accordance with any of the previously described fan-out type packages 1, 101, 201, 301, 401, 501, 601 is mounted on a mounting platform 1000. The mounting platform 1000 may be a plate made of a dielectric material, for instance an epoxy thermoset, thermoplastic material or a glass-fiber enforced epoxy. It may also be a PCB. In this case, a structured metal (e.g., copper) layer, which is not depicted in FIGS. 10 to 14, is provided on the upper surface of the dielectric mounting platform 1000.

The fan-out type package 1 is mounted on the mounting platform 1000. If the backside of the fan-out type package 1 is made of mold resin, the chip 3 is insulated from any metal layer optionally provided at the upper surface of the mounting platform 1000.

In a next process, the fan-out type package 1 is covered by a mold compound 1001. The mold compound 1001 is a dielectric material and may be identical to the material of the mold compound 108 used for encapsulating the chips 103, 203, 303, 403 in FIGS. 3 to 7. According to FIG. 12, the substrate mold compound 1001 completely covers and extends over the top surface of the fan-out type package 1.

Figure 13:
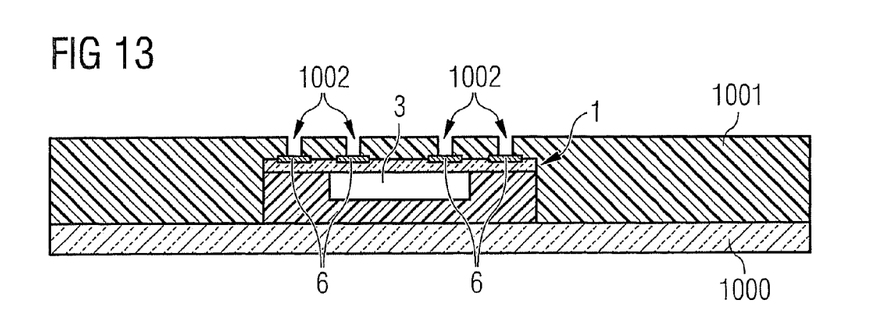
Figure 14:
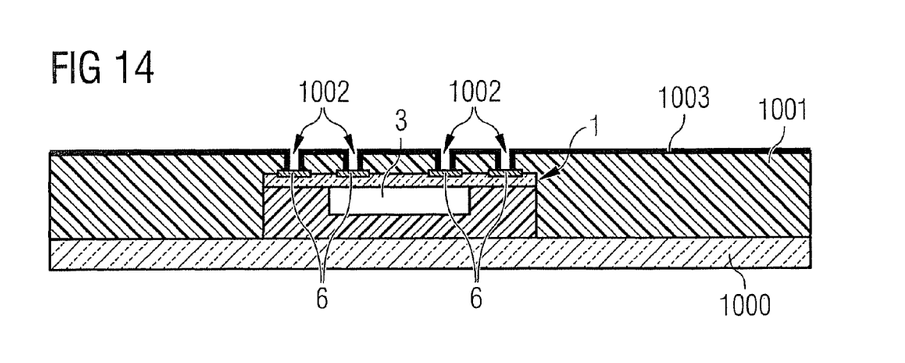
Figure 15:
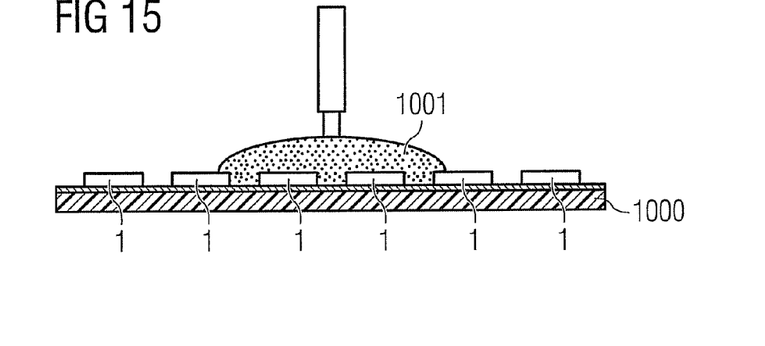
FIGS. 15 to 18 illustrate an example of a process flow for encapsulating fan-out type packages into a mold compound.
Figure 16:
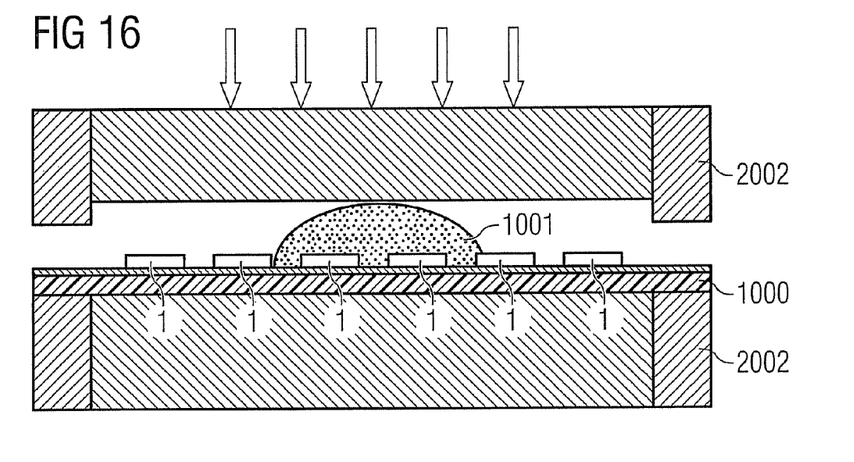
Figure 17:
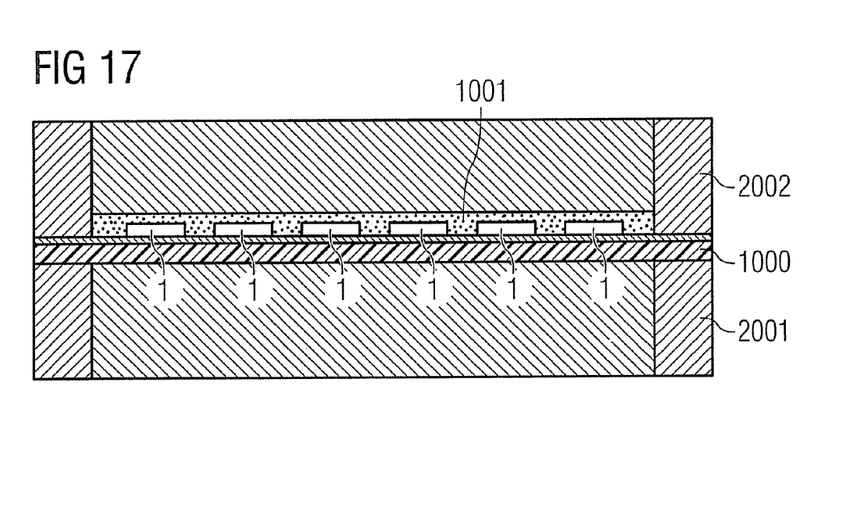

According to FIG. 13, in order to contact the fan-out type package 1, through-holes 1002 are produced in the substrate mold compound 1001 in a region above the fan-out type package 1. The through-holes 1002 open to pads 6 of the fan-out type package 1. As already mentioned before, pads 6 of the fan-out type package 1 are interconnected to pads (not illustrated) on chip 3. As illustrated in FIG. 14, pads 6 of the fan-out type package 1 are connected to external applications by chemical or galvanic deposition of a metal layer 1003 on the mold compound 1001, which extends through the through-holes 1002 down to the package pads 6. The through-holes 1002 may be generated by laser drilling or other suitable processes. Structuring of the metal layer 1003 may be accomplished by using thin-film techniques such as lithographic processes. Further, e.g., using thin-film techniques, it is possible that a plurality of polymer layers and metal layers are deposited alternately over the substrate mold compound 1001 to provide a substrate wiring which may be the same as the top and/or bottom wiring 22, 23 of an SBU laminate substrate 20 illustrated in FIG. 2.

The substrate mold compound 1001 may be applied by various techniques, among them laminating processes, spin-coating or dispensing of a liquid dielectric material, e.g., based on liquid epoxy. FIGS. 15 to 18 illustrate a compression molding process which might be used for encapsulating fan-out type packages 1 into a substrate 2. Besides compression molding, transfer molding or other molding techniques may be used for practicing the resin encapsulation process of FIG. 12.

Figure 18:
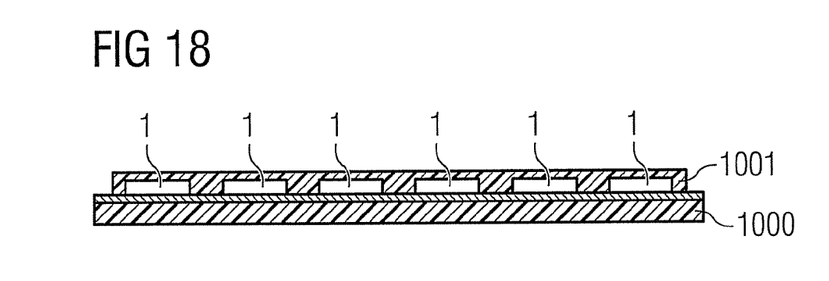

In compression molding, a fast melting or liquid mold compound 1001 is required, which is supplied substantially in the middle of the mounting platform 1000 carrying a number of fan-out type packages 1. The mounting platform 1000, the fan-out type packages 1 and dispensed mold compound 1001 is then transferred between two mold halves 2001, 2002 of a molding tool. In a compression phase depicted in FIG. 16, the molding halves 2001, 2002 are closed under the application of heat. By closing the molding halves 2001, 2002, the liquid mold compound 1001 is distributed within the cavity defined by the molding halves 2001, 2002. In a subsequent curing phase, the mold compound 1001 is cured. Then, a substrate composed of the mounting platform 1000 and mold compound 1001 encapsulating fan-out type packages 1 as depicted in FIG. 18 and represented in FIG. 12 for the case of a single embedded fan-out type package 1 is taken out of the mold tool. Analog to the FIGS. 4 to 7 there could be integrated several different device packages 1 and/or different chips/passives combined into "new" eWLP.

As previously mentioned, the molding of chip 3 in a package 1 as depicted in FIGS. 3 to 7 may be accomplished equally by the process of compression molding. Thus, mounting platform 1000, mold compound substrate 1001 and mold compound fan-out type package 1 could be termed a (fan-out type) mold compound package-in-mold compound substrate structure. Analog to the FIGS. 4 to 7 there could be integrated several different device packages 1 and/or different chips/passives combined into "new" eWLP.

Figure 19:
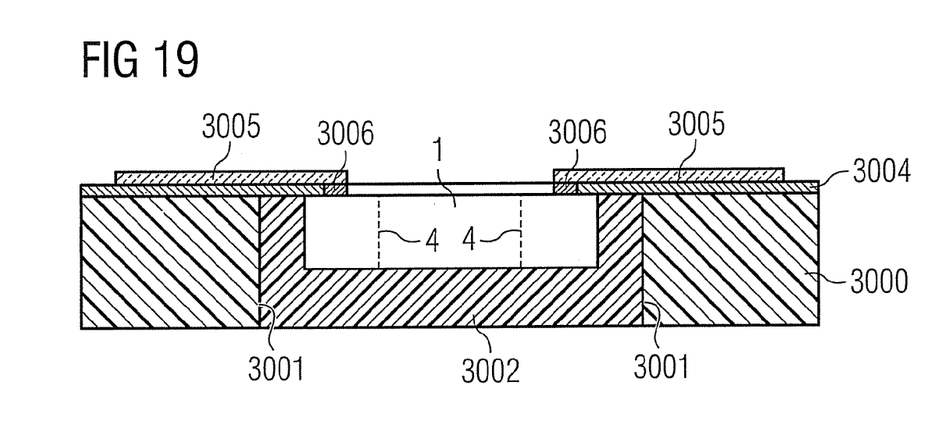
FIG. 19 illustrates a cross-sectional side view of a third substrate embedding a chip package.

Further, it is to be noted that fan-out type packages 1 may be embedded in conventional PCB single layer or multi-layer substrates (where each layer is made e.g., of glass-fiber-reinforced epoxy resin coated by a metal layer) or in ceramic substrates. In these cases, it might be necessary to form a cavity in the substrate and then to insert the fan-out type package 1 into the cavity. FIG. 19 illustrates a substrate 3000 in which a recess 3001 has been machined. The recess 3001 is partially filled by a dielectric material 3002, e.g., epoxy, and a fan-out type package 1 is inserted into the recess 3001. The fan-out type package 1 may be interconnected by thin-film techniques using build-up layers 3004, 3005 and vias 3006 as described above in connection with FIG. 2. It is to be noted that recessed substrate 3000 is not limited to a PCB or ceramic substrate but may be of alternate kind, including mold compound or an SBU laminate substrate. If the package 1 is thin enough, it is obvious that no recess is needed and such packages may be embedded into the layers 22 depicted in FIG. 2.

Although specific embodiments have been illustrated and described herein, it will be appreciated by those of ordinary skill in the art that a variety of alternate and/or equivalent implementations may be substituted for the specific embodiments illustrated and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic assembly, comprising:
   at least one semiconductor chip defining a chip outline;
   a package structure embedding the semiconductor chip, the package structure defining a package periphery;
   the package structure comprising at least one conducting line extending into an area of the package structure that is outside of the outline of the chip and entirely inside the package periphery, and
   a substrate embedding the package structure, wherein the substrate is a printed circuit board.

2. The electronic assembly of claim 1, wherein the package structure comprises a mold compound which extends laterally beyond the outline of the chip.

3. The electronic assembly of claim 1, wherein the package structure comprises at least one further electronic component.

4. The electronic assembly of claim 3, wherein the further electronic component is another chip or a passive element.

5. The electronic assembly of claim 3, wherein the further electronic component is located adjacent to or over the chip.

6. The electronic assembly of claim 1, wherein a backside of the package structure is coated with a conductive material.

7. The electronic assembly of claim 1, wherein a backside of the package structure is coated with a dissipative material.

8. The electronic assembly of claim 1, wherein a backside of the package structure is coated with a structured conductive material.

9. The electronic assembly of claim 1, wherein a backside of the package structure comprises a region of exposed chip material.

10. The electronic assembly of claim 1, wherein the substrate comprises a wiring which is electrically connected to the at least one conducting line.

11. The electronic assembly of claim 10, wherein the substrate comprises vias configured to electrically connect the wiring to the at least one conducting line.

12. The electronic assembly of claim 1, wherein the printed circuit board is a multi-layer printed circuit board and the package structure is embedded in one or more layers of the multi-layer printed circuit board.

13. The electronic assembly of claim 1, wherein the package structure is mounted in a cavity of the ceramic substrate.

14. The electronic assembly of claim 1, wherein the at least one conducting line is sandwiched between two dielectric layers extending laterally beyond the chip outline and being laterally confined to the outline of the package structure.

15. An assembly, comprising:
   a fan-out type package structure comprising a chip, and
   a substrate configured to embed the fan-out type package structure
   wherein the fan-out type package structure comprises a mold compound embedding the chip, a conductive redistribution layer extending laterally beyond the chip outline and being confined to the package outline and a dielectric layer arranged above the conductive redistribution layer and extending laterally beyond the chip outline and being laterally entirely confined to the package outline;
   wherein the substrate comprises a conductive wiring electrically connected to the conductive redistribution layer of the fan-out package structure via openings in the dielectric layer; and
   wherein the substrate is a printed circuit board.

16. The electronic assembly of claim 15, wherein the substrate is a ceramic substrate.

* * * * *